United States Patent
Kato

(10) Patent No.: US 9,318,786 B2
(45) Date of Patent: Apr. 19, 2016

(54) HIGH-FREQUENCY SIGNAL LINE AND ELECTRONIC DEVICE

(71) Applicant: Murata Manufacturing Co., Ltd., Nagaokakyo-shi, Kyoto-fu (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 214 days.

(21) Appl. No.: 14/196,301

(22) Filed: Mar. 4, 2014

(65) Prior Publication Data

US 2014/0184360 A1    Jul. 3, 2014

Related U.S. Application Data

(63) Continuation of application No. PCT/JP2012/082193, filed on Dec. 12, 2012.

(30) Foreign Application Priority Data

Dec. 29, 2011 (JP) .................. 2011-290252

(51) Int. Cl.
*H01P 3/08* (2006.01)
*H05K 1/02* (2006.01)

(52) U.S. Cl.
CPC ........ *H01P 3/082* (2013.01); *H01P 3/08* (2013.01); *H05K 1/0253* (2013.01); *H05K 1/0225* (2013.01); *H05K 2201/09618* (2013.01); *H05K 2201/09727* (2013.01)

(58) Field of Classification Search
CPC .................................... H01P 3/08; H03H 7/38
USPC ............................. 333/1, 4, 5, 33, 238, 246
See application file for complete search history.

(56) References Cited

U.S. PATENT DOCUMENTS

| 2009/0195327 A1* | 8/2009 | Cho .................... H01P 3/003 333/34 |
| 2012/0133458 A1 | 5/2012 | Kato et al. |
| 2014/0048312 A1 | 2/2014 | Kato et al. |

FOREIGN PATENT DOCUMENTS

| JP | 2007-123740 A | 5/2007 |
| JP | 2010-187141 A | 8/2010 |
| WO | 2011/007660 A1 | 1/2011 |
| WO | 2011/018934 A1 | 2/2011 |

OTHER PUBLICATIONS

Official Communication issued in International Patent Application No. PCT/JP2012/082193, mailed on Feb. 12, 2013.

* cited by examiner

*Primary Examiner* — Stephen E Jones
(74) *Attorney, Agent, or Firm* — Keating & Bennett, LLP

(57) ABSTRACT

A high-frequency signal line includes an element assembly including a plurality of insulator layers, a linear signal line provided in or on the element assembly, a first ground conductor provided in or on the element assembly and extending along the signal line, and a plurality of floating conductors provided in or on the element assembly on a first side in a direction of lamination relative to the signal line and the first ground conductor, so as to be arranged along the signal line in an orientation crossing the signal line when viewed in a plan view in the direction of lamination. The floating conductors are opposite to the signal line and the first ground conductor with at least one of the insulator layers positioned therebetween, the floating conductors being connected to neither the signal line nor the first ground conductor. A capacitance is created between the first ground conductor and each of the floating conductors, and has a greater value than a capacitance created between the signal line and the floating conductor.

13 Claims, 12 Drawing Sheets

F I G. 4
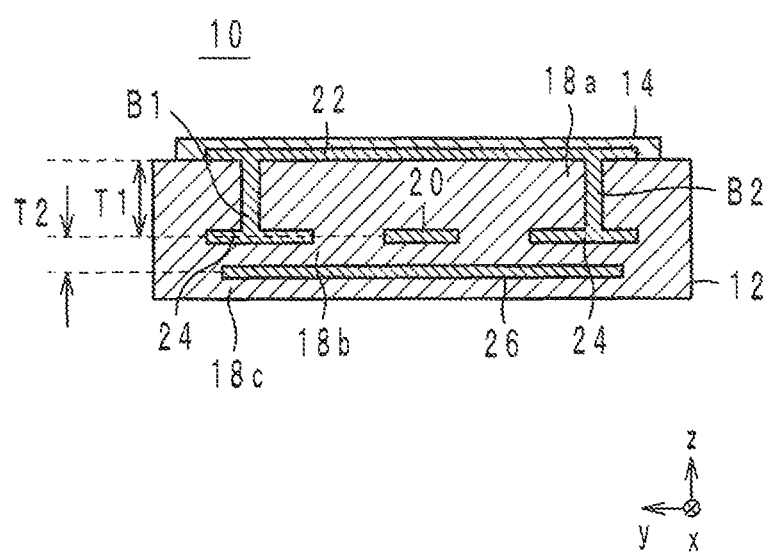

F I G . 5 A
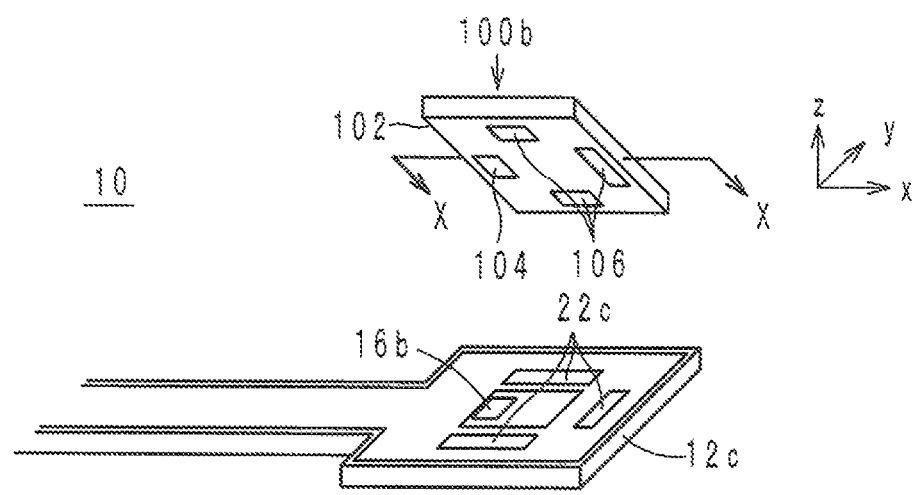
F I G . 5 B
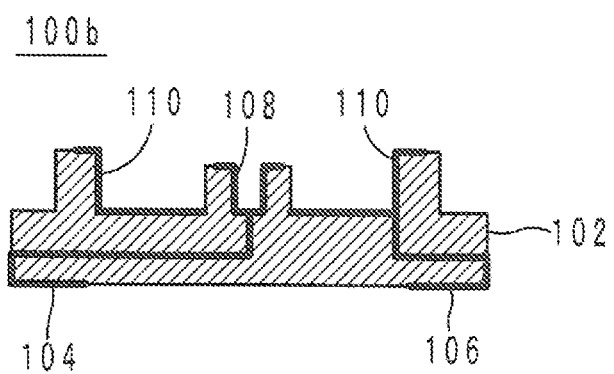

F I G. 6 A
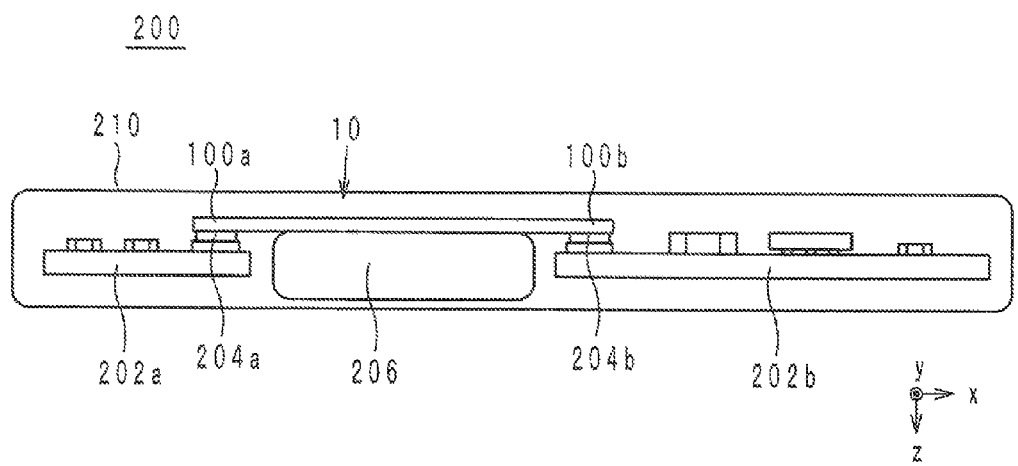
F I G. 6 B
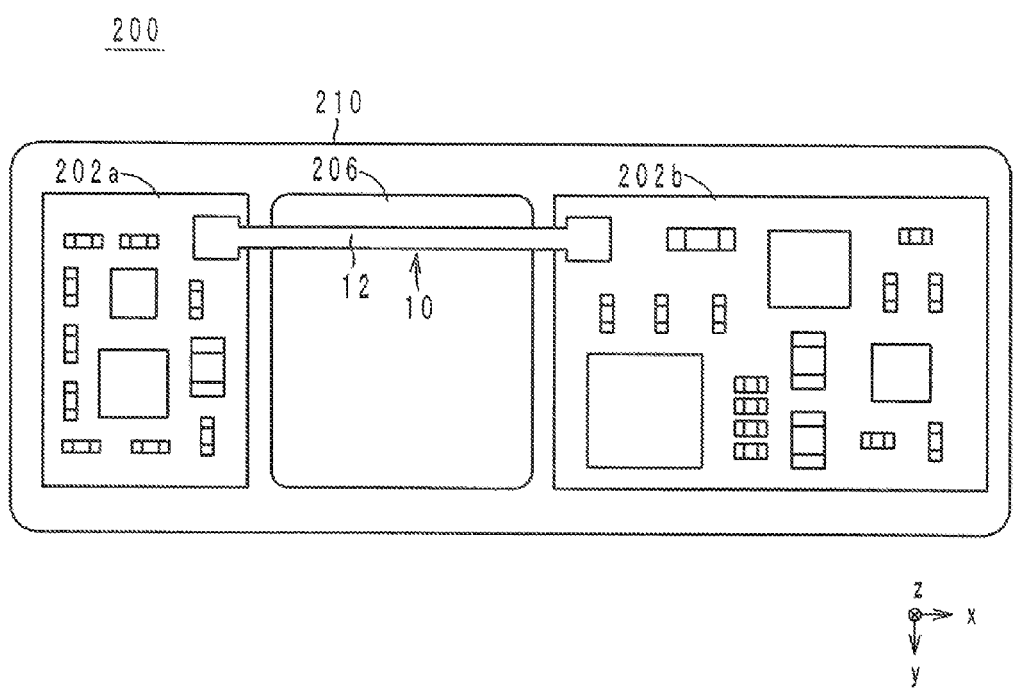

HIGH-FREQUENCY SIGNAL LINE AND ELECTRONIC DEVICE

This application is based on International Application No. PCT/JP2012/082193 filed on Dec. 12, 2012, and Japanese Patent Application No. 2011-290252 filed on Dec. 29, 2011, the entire content of each of which is incorporated herein by reference.

BACKGROUND OF THE INVENTION

1. Field of the Invention

The present invention relates to high-frequency signal lines and electronic devices, more particularly to a high-frequency signal line including a signal line provided on a flexible element assembly, and an electronic device including the high-frequency signal line.

2. Description of the Related Art

In the case of a high-frequency signal line having a tri-plate stripline structure formed by a signal line being positioned between upper and lower ground conductors, the signal line is widened in order to reduce high-frequency transmission loss. Accordingly, the signal line has an increased surface area, and the ground conductors have larger areas opposed to the signal line. As a result, high-frequency transmission loss in the signal line is reduced. The high-frequency transmission loss refers to a loss mainly caused by a high-frequency signal being converted into heat in an impedance-matching situation.

However, widening the signal line increases the area of the signal line that is opposed to the ground conductors, resulting in increased capacitance between the signal line and the ground conductors. Accordingly, to set the characteristic impedance of the high-frequency signal line at a predetermined characteristic impedance value (e.g., 50Ω), it is necessary to increase the distance between the signal line and each ground conductor, thereby reducing the capacitance therebetween. However, increasing the distance between the signal line and the ground conductor results in an increased thickness of the high-frequency signal line.

Accordingly, there is a flexible board proposed by Japanese Patent Laid-Open Publication No. 2007-123740. FIG. 12 illustrates the flexible board 600 disclosed in Japanese Patent Laid-Open Publication No. 2007-123740, as viewed in a plan view in the direction of lamination.

The flexible board 600 includes a signal line 602 and a ground layer 604. The signal line 602 is a linear conductor. The ground layer 604 is laminated on a dielectric layer provided above the signal line 602 in the direction of lamination. Moreover, although not shown, another ground layer is provided below the signal line 602 in the direction of lamination. In addition, the flexible board 600 has a plurality of openings 606 provided in the ground layer 604. The openings 606 are in the form of rectangles aligned above the signal line 602 in the direction in which the signal line 602 extends. As a result, the signal line 602, when viewed in a top view in the direction of lamination, overlaps in part with the ground layer 604. Therefore, the capacitance that is created between the signal line 602 and the ground layer 604 is reduced. Thus, the distance between the signal line 602 and the ground layer 604 can be reduced, so that the flexible board 600 can be rendered thinner.

In this manner, various attempts have been made to achieve thinner high-frequency signal lines.

SUMMARY OF THE INVENTION

A high-frequency signal line according to a preferred embodiment of the present invention includes an element assembly including a plurality of insulator layers, a linear signal line provided in or on the element assembly, a first ground conductor provided in or on the element assembly and extending along the signal line, and a plurality of floating conductors provided in or on the element assembly on a first side in a direction of lamination relative to the signal line and the first ground conductor, so as to be arranged along the signal line in an orientation crossing the signal line when viewed in a plan view in the direction of lamination, wherein the floating conductors are opposite to the signal line and the first ground conductor with at least one of the insulator layers positioned therebetween, the floating conductors being connected to neither the signal line nor the first ground conductor. A capacitance is created between the first ground conductor and each of the floating conductors, and has a greater value than a capacitance created between the signal line and the floating conductor.

An electronic device according to a preferred embodiment of the present invention includes a housing and a high-frequency signal line accommodated in the housing. The high-frequency signal line includes an element assembly including a plurality of insulator layers, a linear signal line provided in or on the element assembly, a first ground conductor provided in or on the element assembly and extending along the signal line, and a plurality of floating conductors provided in or on the element assembly on one side in a direction of lamination relative to the signal line and the first ground conductor, so as to be arranged along the signal line in an orientation crossing the signal line when viewed in a plan view in the direction of lamination, wherein the floating conductors are opposite to the signal line and the first ground conductor with at least one of the insulator layers positioned therebetween, the floating conductors being connected to neither the signal line nor the first ground conductor. A capacitance is created between the first ground conductor and each of the floating conductors, and has a greater value than a capacitance created between the signal line and the floating conductor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is another cross-sectional structure view of the high-frequency signal line.

FIG. 5A is an external oblique view of a connector of the high-frequency signal line.

FIG. 5B is a cross-sectional structure view of the connector of the high-frequency signal line.

FIGS. 6A and 6B illustrate an electronic device provided with a high-frequency signal line as viewed in plan views in y-axis and z-axis directions, respectively.

DETAILED DESCRIPTION OF THE PREFERRED EMBODIMENTS

Hereinafter, a high-frequency signal line according to preferred embodiments of the present invention, along with an electronic device including the signal line, will be described with reference to the drawings.

Figure 1:
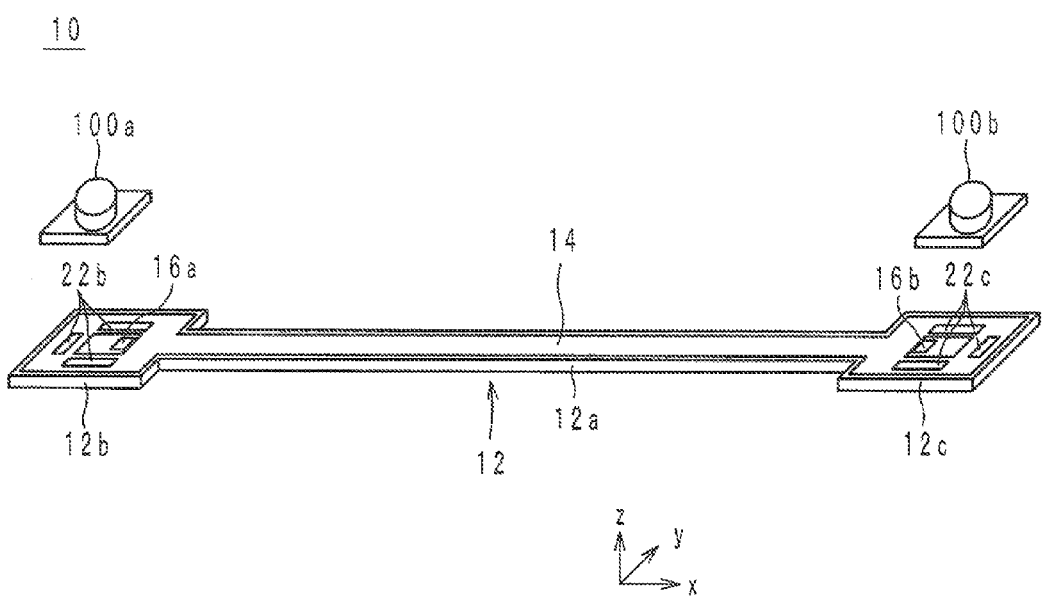
FIG. 1 is an external oblique view of a high-frequency signal line according to a preferred embodiment of the present invention.
Figure 2:
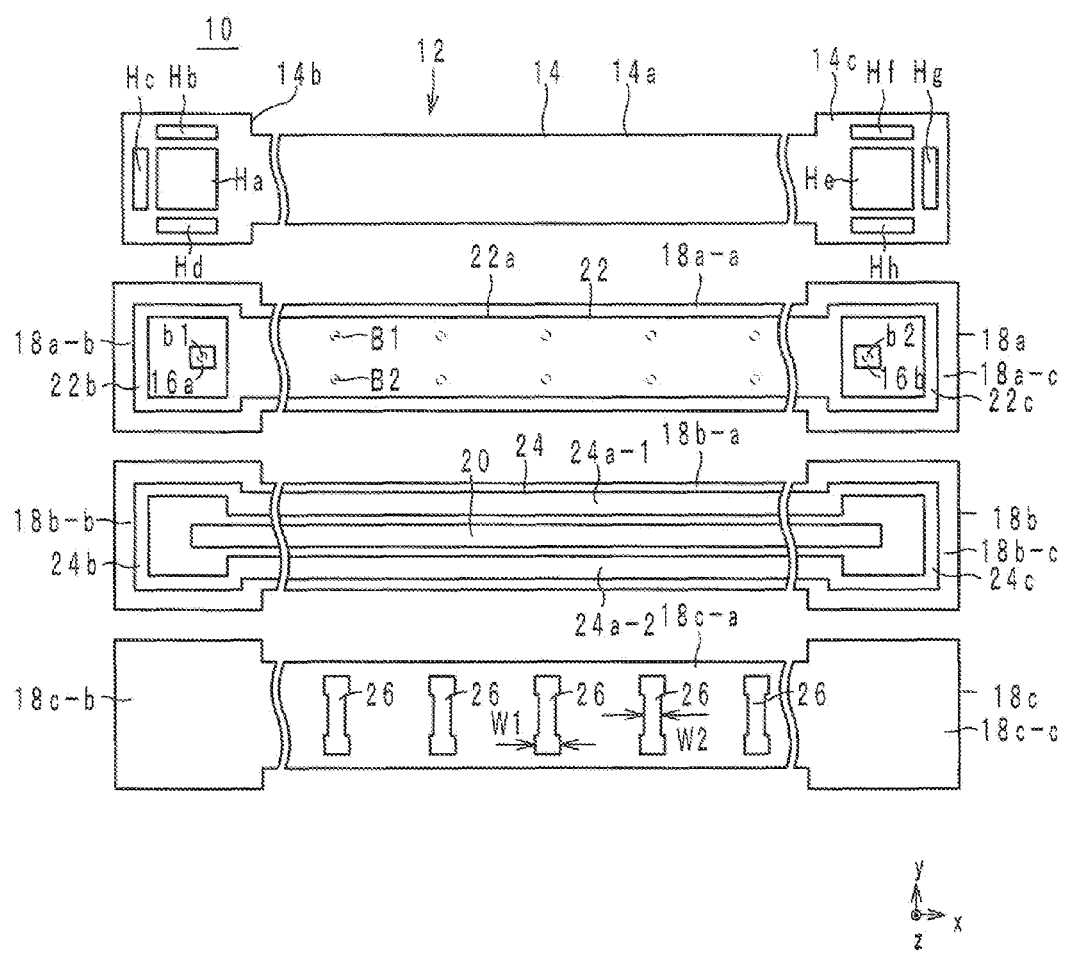
FIG. 2 is an exploded view of a dielectric element assembly of the high-frequency signal line in FIG. 1.
Figure 3:
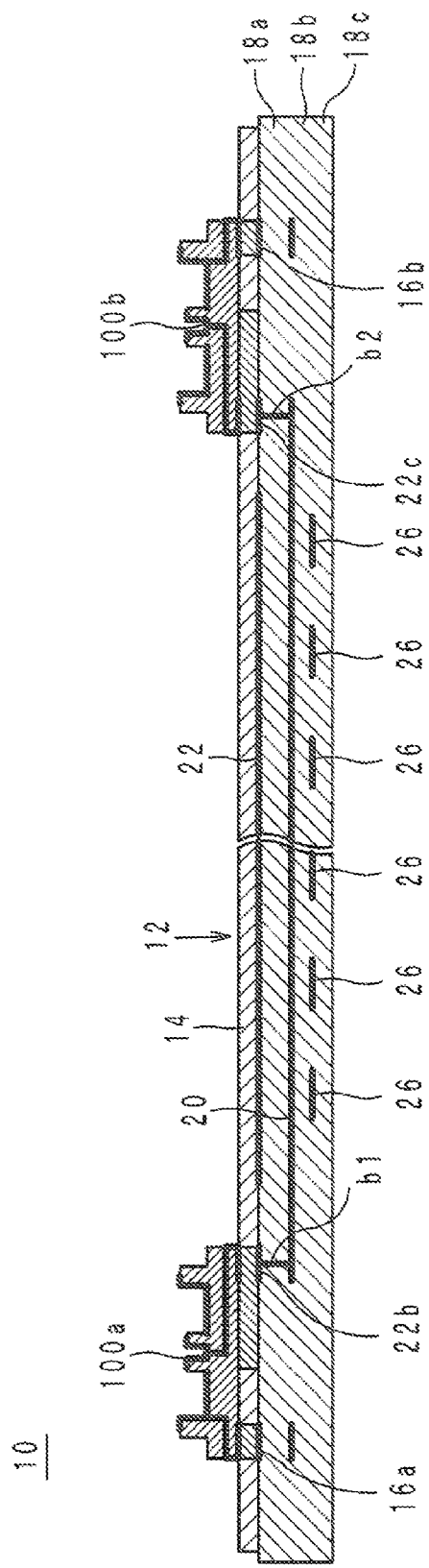
FIG. 3 is a cross-sectional structure view of the high-frequency signal line in FIG. 1.

The configuration of the high-frequency signal line according to a preferred embodiment of the present invention will be described below with reference to the drawings. FIG. 1 is an external oblique view of the high-frequency signal line 10 according to a preferred embodiment of the present invention. FIG. 2 is an exploded view of a dielectric element assembly 12 of the high-frequency signal line 10 in FIG. 1. FIG. 3 is a cross-sectional structure view of the high-frequency signal line 10 in FIG. 1. FIG. 4 is another cross-sectional structure view of the high-frequency signal line 10. FIG. 5A is an external oblique view of a connector 100b of the high-frequency signal line 10. FIG. 5B is a cross-sectional structure view of the connector 100b. In FIGS. 1 through 5, the direction of lamination of the high-frequency signal line 10 will be defined as a z-axis direction. Moreover, the longitudinal direction of the high-frequency signal line 10 will be defined as an x-axis direction, and the direction perpendicular to the x-axis and z-axis directions will be defined as a y-axis direction.

The high-frequency signal line 10 is preferably used in, for example, an electronic device such as a cell phone, to connect two high-frequency circuits. The high-frequency signal line 10 includes the dielectric element assembly 12, external terminals 16 (16a and 16b), a signal line 20, ground conductors 22 and 24, floating conductors 26, via-hole conductors b1, b2, B1, and B2, a connector 100a, and the connector 100b, as shown in FIGS. 1 through 3.

The dielectric element assembly 12, when viewed in a plan view in the z-axis direction, extends in the x-axis direction, and includes a line portion 12a and connecting portions 12b and 12c. The dielectric element assembly 12 is a laminate preferably formed by laminating a protective layer 14 and dielectric sheets (insulator layers) 18 (18a to 18c) in this order, from the positive side to the negative side in the z-axis direction, as shown in FIG. 2. In the following, the principal surface of the dielectric element assembly 12 that is located on the positive side in the z-axis direction will be referred to as a top surface (first principal surface), and the principal surface of the dielectric element assembly 12 that is located on the negative side in the z-axis direction will be referred to as a bottom surface (second principal surface).

The line portion 12a extends in the x-axis direction. The connecting portion 12b has a rectangular or substantially rectangular shape connected to the end of the line portion 12a on the negative side in the x-axis direction, and the connecting portion 12c has a rectangular or substantially rectangular shape connected to the end of the line portion 12a on the positive side in the x-axis direction. The width of each of the connecting portions 12b and 12c in the y-axis direction is greater than the width of the line portion 12a in the y-axis direction.

The dielectric sheets 18, when viewed in a plan view in the z-axis direction, extend in the x-axis direction, and have the same shape as the dielectric element assembly 12. The dielectric sheets 18 are made of a flexible thermoplastic resin such as polyimide or liquid crystal polymer. The thickness T1 of the dielectric sheet 18a is greater than the thickness T2 of the dielectric sheet 18b, as shown in FIG. 4. For example, the thickness T1 preferably is about 50 μm to about 300 μm, for example, after lamination of the dielectric sheets 18a to 18c. In the present preferred embodiment, the thickness T1 preferably is about 150 μm, for example. Moreover, the thickness T2 preferably is about 10 μm to about 100 μm, for example. In the present preferred embodiment, the thickness T2 preferably is about 50 μm, for example. In the following, the principal surface of each of the dielectric sheets 18 that is located on the positive side in the z-axis direction will be referred to as a top surface, and the principal surface of each of the dielectric sheets 18 that is located on the negative side in the z-axis direction will be referred to as a bottom surface.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a define the line portion 12a. The connecting portions 18a-b, 18b-b, and 18c-b define the connecting portion 12b. The connecting portions 18a-c, 18b-c, and 18c-c define the connecting portion 12c.

The external terminal 16a is a rectangular or substantially rectangular conductor provided near the center of the top surface of the connecting portion 18a-b, as shown in FIGS. 1 and 2. The external terminal 16b is a rectangular or substantially rectangular conductor provided near the center of the top surface of the connecting portion 18a-c, as shown in FIGS. 1 and 2. The external terminals 16a and 16b are made of a metal material mainly composed of silver or copper and having a low specific resistance. In addition, the top surfaces of the external terminals 16a and 16b preferably are plated with gold.

The signal line 20 is a linear conductor provided in the dielectric element assembly 12 and extending on the top surface of the dielectric sheet 18b in the x-axis direction, as shown in FIG. 2. The signal line 20, when viewed in a plan view in the z-axis direction, overlaps with the external terminals 16a and 16b at opposite ends. The signal line 20 is made of a metal material mainly composed of silver or copper and having a low specific resistance.

The ground conductor 24 (first ground conductor) is provided on the top surface of the dielectric sheet 18b on which the signal line 20 is provided. Accordingly, the ground conductor 24 is positioned between the dielectric sheets 18a and 18b, as shown in FIG. 3. Moreover, the ground conductor 24 includes two line portions 24a-1 and 24a-2, which, when viewed in a plan view in the z-axis direction, are positioned on opposite sides in the y-axis direction relative to the signal line 20 within the dielectric element assembly 12, so as to extend along the signal line 20 in the x-axis direction.

More specifically, in addition to the line portions 24a-1 and 24a-2, the ground conductor 24 includes terminal portions 24b and 24c. The line portion 24a-1 is provided on the top surface of the line portion 18b-a, and extends in the x-axis direction on the positive side in the y-axis direction relative to the signal line 20. The line portion 24a-2 is provided on the top surface of the line portion 18b-a, and extends in the x-axis direction on the negative side in the y-axis direction relative to the signal line 20. The terminal portion 24b is provided on the top surface of the connecting portion 18b-b, in the form of a rectangular or substantially rectangular rim around the external terminal 16a when viewed in a plan view in the z-axis direction. The terminal portion 24b is connected to the ends of the line portions 24a-1 and 24a-2 on the negative side in the x-axis direction. The terminal portion 24c is provided on the top surface of the connecting portion 18b-c, in the form of a rectangular or substantially rectangular rim around the external terminal 16b when viewed in a plan view in the z-axis direction. The terminal portion 24c is connected to the ends of the line portions 24a-1 and 24a-2 on the positive side in the x-axis direction. The ground conductor 24 is made of a metal material mainly composed of silver or copper and having a low specific resistance.

The ground conductor 22 (second ground conductor) is provided on the top surface of the dielectric sheet 18a. Accordingly, the ground conductor 22 is positioned on the positive side in the z-axis direction relative to the signal line 20 and the ground conductor 24, so as to be opposite to the signal line 20 and the ground conductor 24 with the dielectric sheet 18a positioned therebetween.

More specifically, the ground conductor 22 includes a line portion 22a and terminal portions 22b and 22c. The line portion 22a is provided on the top surface of the line portion 18a-a, and extends in the x-axis direction. The terminal portion 22b is provided on the top surface of the connecting portion 18a-b, in the form of a rectangular or substantially rectangular rim around the external terminal 16a when viewed in a plan view in the z-axis direction. The terminal portion 22b is connected to the end of the line portion 22a on the negative side in the x-axis direction. The terminal portion 22c is provided on the top surface of the connecting portion 18a-c, in the form of a rectangular or substantially rectangular rim around the external terminal 16b when viewed in a plan view in the z-axis direction. The terminal portion 22c is connected to the end of the line portion 22a on the positive side in the x-axis direction. The ground conductor 22 is made of a metal material mainly composed of silver or copper and having a low specific resistance.

The floating conductors 26 are positioned on the negative side in the z-axis direction relative to the signal line 20 and the ground conductor 24 within the dielectric element assembly 12, as shown in FIG. 2, and more specifically, the floating conductors 26 are disposed on the top surface of the dielectric sheet 18c. Accordingly, the floating conductors 26 are positioned between the dielectric sheets 18b and 18c, as shown in FIG. 3. The floating conductors 26 extend in the y-axis direction, so as to be perpendicular or substantially perpendicular to the signal line 20 when viewed in a plan view in the z-axis direction. Moreover, the floating conductors 26 are aligned at equal intervals in the x-axis direction along the signal line 20 on the top surface of the dielectric sheet 18c. The interval between the floating conductors 26 is preferably less than or equal to half the wavelength of a high-frequency signal to be transmitted through the signal line 20.

Furthermore, the floating conductors 26 are opposite to the signal line 20 and the line portions 24a-1 and 24a-2 with the dielectric sheet 18b positioned therebetween. The width W1 of each floating conductor 26 at opposite ends in the y-axis direction is greater than the width W2 of the floating conductor 26 at portions other than the ends. Specifically, the width W1 of the floating conductor 26 at the portions that overlap with the line portions 24a-1 and 24a-2 is greater than the width W2 of the floating conductor 26 at the portion that overlaps with the signal line 20. Therefore, the value of a capacitance C2, which is created between the floating conductor 26 and the line portions 24a-1 and 24a-2 of the ground conductor 22, is greater than or equal to the value of a capacitance C1, which is created between the floating conductor 26 and the signal line 20.

Furthermore, the floating conductors 26 are not connected to either the signal line 20 or the ground conductors 22 and 24, nor even to any other conductors. Therefore, the potential of each floating conductor 26 is at a floating potential between the potential of the signal line 20 and the potential of the ground conductors 22 and 24 (i.e., the ground potential). The floating conductors 26 thus configured are made of a metal material mainly composed of silver or copper and having a low specific resistance.

The via-hole conductor b1 pierces through the connecting portion 18a-b of the dielectric sheet 18a in the z-axis direction, so as to connect the external terminal 16a and the end of the signal line 20 that is located on the negative side in the x-axis direction. The via-hole conductor b2 pierces through the connecting portion 18a-c of the dielectric sheet 18a in the z-axis direction, so as to connect the external terminal 16b and the end of the signal line 20 that is located on the positive side in the x-axis direction. Accordingly, the signal line 20 is connected between the external terminals 16a and 16b. The via-hole conductors b1 and b2 are made of a metal material mainly composed of silver or copper and having a low specific resistance.

The via-hole conductors B1 pierce through the line portion 18a-a of the dielectric sheet 18a in the z-axis direction, so as to be aligned at equal intervals in the line portion 18a-a. The via-hole conductors B1, when viewed in a plan view in the z-axis direction, are positioned on the positive side in the y-axis direction relative to the signal line 20. The via-hole conductors B1 connect the ground conductor 22 and the line portion 24a-1 of the ground conductor 24. The via-hole conductors B1 are made of a metal material mainly composed of silver or copper and having a low specific resistance.

The via-hole conductors B2 pierce through the line portion 18a-a of the dielectric sheet 18a in the z-axis direction, so as to be aligned at equal intervals in the line portion 18a-a. The via-hole conductors B2, when viewed in a plan view in the z-axis direction, are positioned on the negative side in the y-axis direction relative to the signal line 20. The via-hole conductors B2 connect the ground conductor 22 and the line portion 24a-2 of the ground conductor 24. The via-hole conductors B2 are made of a metal material mainly composed of silver or copper and having a low specific resistance.

In the high-frequency signal line 10 thus configured, the distance to the ground conductor 22 from each of the signal line 20 and the ground conductor 24 in the z-axis direction preferably is approximately equal to the thickness T1 of the dielectric sheet 18a, e.g., about 50 μm to about 300 μm, as shown in FIG. 4. In the present preferred embodiment, the distance to the ground conductor 22 from each of the signal line 20 and the ground conductor 24 in the z-axis direction preferably is about 150 μm, for example. On the other hand, the distance to the floating conductor 26 from each of the signal line 20 and the ground conductor 24 in the z-axis direction preferably is approximately equal to the thickness T2 of the dielectric sheet 18b, e.g., about 10 μm to about 100 μm, as shown in FIG. 4. In the present preferred embodiment, the distance to the floating conductor 26 from each of the signal line 20 and the ground conductor 24 in the z-axis direction preferably is about 50 μm, for example. That is, the distance to the ground conductor 22 from each of the signal line 20 and the ground conductor 24 in the z-axis direction preferably is designed to be greater than the distance to the floating conductor 26 from each of the signal line 20 and the ground conductor 24 in the z-axis direction.

The protective layer 14 covers approximately the entire top surface of the dielectric sheet 18a. Accordingly, the ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, including the line portion 22a.

The connecting portion 14b is connected to the end of the line portion 14a on the negative side in the x-axis direction, so as to cover the top surface of the connecting portion 18a-b. The connecting portion 14b has openings Ha to Hd provided therein. The opening Ha is a rectangular or substantially rectangular opening positioned approximately at the center of the connecting portion 14b. The external terminal 16a is exposed to the outside from the opening Ha. The opening Hb is a rectangular or substantially rectangular opening provided on the positive side in the y-axis direction relative to the opening Ha. The opening Hc is a rectangular or substantially rectangular opening provided on the negative side in the x-axis direction relative to the opening Ha. The opening Hd is a rectangular or substantially rectangular opening provided on the negative side in the y-axis direction relative to the opening Ha. The terminal portion 22b is exposed to the outside from the openings Hb to Hd, so that the exposed portions serve as external terminals.

The connecting portion 14c is connected to the end of the line portion 14a on the positive side in the x-axis direction, so as to cover the top surface of the connecting portion 18a-c. The connecting portion 14c has openings He to Hh provided therein. The opening He is a rectangular or substantially rectangular opening positioned approximately at the center of the connecting portion 14c. The external terminal 16b is exposed to the outside from the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside from the openings Hf to Hh, so that the exposed portions serve as external terminals.

The connectors 100a and 100b are mounted on the top surfaces of the connecting portions 12b and 12c, respectively. The connectors 100a and 100b are configured in the same manner, and therefore, only the configuration of the connector 100b will be described below by way of example.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate and a cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the parts of the terminal portion 22c that are exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c. As a result, the signal line 20 is electrically connected to the center conductor 108. In addition, the ground conductors 22 and 24 are electrically connected to the external conductor 110.

The high-frequency signal line 10 is used in a manner as will be described below. FIGS. 6A and 6B illustrate the electronic device 200 provided with the high-frequency signal line 10 as viewed in plan views in the y-axis and z-axis directions, respectively.

The electronic device 200 includes the high-frequency signal line 10, circuit boards 202a and 202b, receptacles 204a and 204b, a battery pack (metallic body) 206, and a housing 210.

The housing 210 accommodates the circuit boards 202a and 202b, the receptacles 204a and 204b, and the battery pack 206. For example, the circuit board 202a has provided thereon a transmission or reception circuit including an antenna. The circuit board 202b has, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal line 10 connects the circuit boards 202a and 202b.

Here, the top surface of the dielectric element assembly 12 (more specifically, the protective layer 14) is in contact with the battery pack 206. In addition, the top surface of the dielectric element assembly 12 is fixed to the battery pack 206 by an adhesive or suchlike. The top surface of the dielectric element assembly 12 is a principal surface positioned beyond the ground conductor 22 when viewed from the position of the signal line 20. That is, the ground conductor 22, which is in solid form, is positioned between the signal line 20 and the battery pack 206.

A non-limiting example of a method for producing the high-frequency signal line 10 will be described below with reference to FIG. 2. While the following description focuses on one high-frequency signal line 10 as an example, in actuality, large-sized dielectric sheets are laminated and cut, so that a plurality of high-frequency signal lines 10 are produced at the same time.

Prepared first are dielectric sheets 18 made of a thermoplastic resin and having their entire top surfaces copper-foiled. The copper-foiled top surfaces of the dielectric sheets 18 are smoothened, for example, by galvanization for rust prevention. The thickness of the copper foil preferably is about 10 µm to about 20 µm, for example.

Next, external terminals 16 and a ground conductor 22, as shown in FIG. 2, are formed on the top surface of the dielectric sheet 18a by photolithography. Specifically, resists are printed on the copper foil of the dielectric sheet 18a in the same patterns as the external terminals 16 (16a and 16b) and the ground conductor 22 shown in FIG. 2. Then, any portions of the copper foil that are not coated with the resists are removed by etching. Thereafter, the resists are removed. As a result, the external terminals 16 and the ground conductor 22 are formed on the top surface of the dielectric sheet 18a, as shown in FIG. 2.

Next, a signal line 20 and a ground conductor 24, as shown in FIG. 2, are formed on the top surface of the dielectric sheet 18b by photolithography. In addition, floating conductors 26, as shown in FIG. 2, are formed on the top surface of the dielectric sheet 18c by photolithography. Note that the above photolithographic steps are the same as the photolithographic steps for forming the external terminals 16 and the ground conductor 22, and therefore, any descriptions thereof will be omitted.

Next, via-holes are bored through the dielectric sheet 18a by irradiating its bottom surface with laser beams where via-hole conductors b1, b2, B1, and B2 are to be formed. Thereafter, the via-holes provided in the dielectric sheet 18a are filled with a conductive paste.

Next, the dielectric sheets 18a to 18c are stacked in this order, from the positive side to the negative side in the z-axis direction. Then, the dielectric sheets 18a to 18c are heated and pressed from the positive side toward the negative side in the z-axis direction, thus softening the dielectric sheets 18a to 18c so as to be bonded and integrated, while solidifying the conductive paste in the via-holes, so that the via-hole conductors b1, b2, B1, and B2 are formed, as shown in FIG. 2. Note that the dielectric sheets 18 may be integrated using an adhesive, such as epoxy resin, rather than by thermocompression bonding. In addition, after the dielectric sheets 18 are integrated, the via-hole conductors b1, b2, B1, and B2 may be formed by providing via-holes in the dielectric sheets 18 and filling the via-holes with a conductive paste or forming a plated coating over the via-holes. Note that the via-hole conductors encompass conductors that fill via-holes completely, as well as conductors that cover the inner circumferential surfaces of via-holes without filling the via-holes completely.

Lastly, a resin (resist) paste is applied to the dielectric sheet 18a so as to form a protective layer 14 thereon. As a result, the high-frequency signal line 10 shown in FIG. 1 is obtained.

The high-frequency signal line 10 according to the present preferred embodiment achieves a significant reduction in high-frequency transmission loss and also a significant reduction in thickness. By reducing the thickness, mechanical bending of the high-frequency signal line 10 can be performed more readily. Moreover, the high-frequency signal line 10 is resistant to bending, and therefore, is less likely to be broken by bending. Thus, it is possible to obtain a high-frequency signal line 10 that can be bent repeatedly without breaking.

Figure 7:
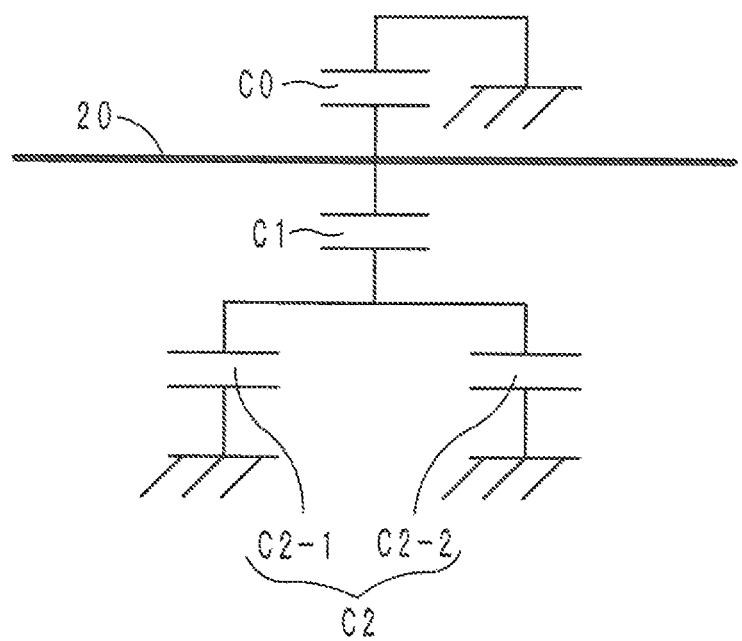
FIG. 7 is an equivalent circuit diagram of the high-frequency signal line.

FIG. 7 is an equivalent circuit diagram of the high-frequency signal line 10. In the high-frequency signal line 10, the floating conductors 26 are arranged along the signal line 20 on the negative side in the z-axis direction relative to the signal line 20 and the ground conductor 24 within the dielectric element assembly 12, so as to be opposite to the signal line 20 and the ground conductor 24 with the dielectric sheet 18b positioned therebetween. In addition, the floating conductors 26 are connected to neither the signal line 20 nor the ground conductor 24, and are kept at a floating potential between the potential of the signal line 20 and the potential of the ground conductor 24. Accordingly, the capacitance C1 is created between the signal line 20 and each floating conductor 26, and the capacitance C2 is created between the ground conductor 24 and the floating conductor 26. The value of the capacitance C2 is a sum of the value of a capacitance C2-1, which is created between the line portion 24a-1 and the floating conductor 26, and the value of a capacitance C2-2, which is created between the line portion 24a-2 and the floating conductor 26. Accordingly, the capacitances C1 and C2 are connected in a series between the signal line 20 and the ground conductor 24, as shown in FIG. 7. Therefore, the value of a capacitance Ct between the signal line 20 and the ground conductor 24 is equal or substantially equal to the combined value of the capacitances C1 and C2. Moreover, a capacitance C0 is created between the signal line 20 and the ground conductor 22.

Here, in an attempt to create the capacitance Ct between the signal line and the ground conductor without using the floating conductor 26, it is necessary to position the ground conductor so as to be opposed to the signal line on the negative side in the z-axis direction relative to the signal line, in order to create the capacitance between the ground conductor and the signal line. However, when the opposed areas of the ground conductor and the signal line are large, the capacitance between the ground conductor and the signal line becomes excessively large. Accordingly, to maintain an appropriate value of the capacitance Ct between the ground conductor and the signal line, the distance between the ground conductor and the signal line in the z-axis direction needs to be greater than the distance to the floating conductor from each of the signal line and the ground conductor in the z-axis direction. That is, in the case where the floating conductors 26 are not used, the high-frequency signal line becomes thicker. Therefore, by using the floating conductors 26, the high-frequency signal line 10 can be reduced in thickness. In addition, when the high-frequency signal line 10 is sufficiently thin, the signal line 20 can be widened, thus reducing high-frequency transmission loss in the high-frequency signal line 10.

Furthermore, the high-frequency signal line 10 can be readily bent in use, as will be described below. Specifically, since the high-frequency signal line 10 are provided with the floating conductors 26, the ground conductor 24 is positioned on the dielectric sheet 18b, i.e., the same dielectric sheet as that on which the signal line 20 is provided. Therefore, the distance between the ground conductors 22 and 24 in the z-axis direction is reduced, so that the via-hole conductors B1 and B2 can be shortened. The via-hole conductors B1 and B2 are more resistant to deformation when compared to the dielectric sheets 18, and therefore, shortening the via-hole conductors B1 and B2 renders it possible to more readily bend the high-frequency signal line 10 in use.

Furthermore, also for the reasons given below, the high-frequency signal line 10 can be readily bent in use. Specifically, in an attempt to create the capacitance Ct between the signal line and the ground conductor without using the floating conductor 26, it is necessary to position the ground conductor on the negative side in the z-axis direction relative to the signal line. Here, as the ground conductor becomes more distant from the signal line in the direction of lamination, more tensile or compressive stress is applied to the ground conductor when the high-frequency signal line is bent. That is, the high-frequency signal line becomes more difficult to be bent.

Therefore, the high-frequency signal line 10 is provided with the floating conductors 26, and as a result of that, the ground conductor 24 is positioned on the dielectric sheet 18b on which the signal line 20 is provided. Accordingly, the distance between the signal line 20 and the ground conductor 24 in the z-axis direction is reduced. In addition, the signal line 20 and the ground conductor 24 do not overlap with each other when they are viewed in a plan view. Therefore, the high-frequency signal line 10 can be readily bent in use. Moreover, the floating conductors 26 are linear conductors that extend in the y-axis direction, rather than solid conductor layers, and they are arranged at equal intervals in the x-axis direction. Thus, the high-frequency signal line 10 can be more readily bent in portions where the floating conductors 26 are not provided.

Furthermore, the high-frequency signal line 10 renders it possible to inhibit spurious radiation, as will be described below. More specifically, in the high-frequency signal line 10, the value of the capacitance C1 created between the signal line 20 and the floating conductor 26 is smaller than the value of the capacitance C2 created between the ground conductor 24 and the floating conductor 26. Accordingly, the number of electric lines of force created between the signal line 20 and the floating conductor 26 is less than the number of electric lines of force created between the ground conductor 24 and the floating conductor 26. Therefore, noise emitted from the signal line 20 flows through the floating conductor 26 to the ground conductor 24, and therefore is less likely to be emitted from the floating conductor 26 to the outside of the high-frequency signal line 10. Thus, the high-frequency signal line 10 inhibits spurious radiation.

Furthermore, also for the reasons given below, the high-frequency signal line 10 renders it possible to inhibit spurious radiation. Specifically, in the case of a high-frequency signal line without the floating conductors 26, the characteristic impedance of the signal line is approximately uniform across its length. In this case, a standing wave having a relatively long wavelength occurs with nodes at opposite ends of the signal line where the characteristic impedance is high. The standing wave having a relatively long wavelength has a lower frequency than the frequency of a high-frequency signal to be transmitted through the signal line. Therefore, when a high-frequency signal is transmitted through the signal line, a component included in the high-frequency signal causes a standing wave having a relatively long wavelength in the signal line. As a result, the standing wave causes spurious radiation.

Therefore, in the high-frequency signal line 10, the interval between the floating conductors 26 is preferably set to be less than or equal to half the wavelength of a high-frequency signal to be transmitted through the signal line 20. The characteristic impedance of the signal line 20 is lower where the floating conductors 26 are provided than where no floating conductors 26 are provided. Accordingly, a standing wave has nodes where the floating conductors 26 are provided, and antinodes where no floating conductors 26 are provided. Therefore, when the interval between the floating conductors 26 is set to be less than or equal to half the wavelength of the high-frequency signal, the high-frequency signal does not include any component having a wavelength that causes a standing wave. Thus, the high-frequency signal line 10 inhibits a standing wave from being produced in the signal line 20, thereby preventing spurious radiation.

First Modification

Figure 8:
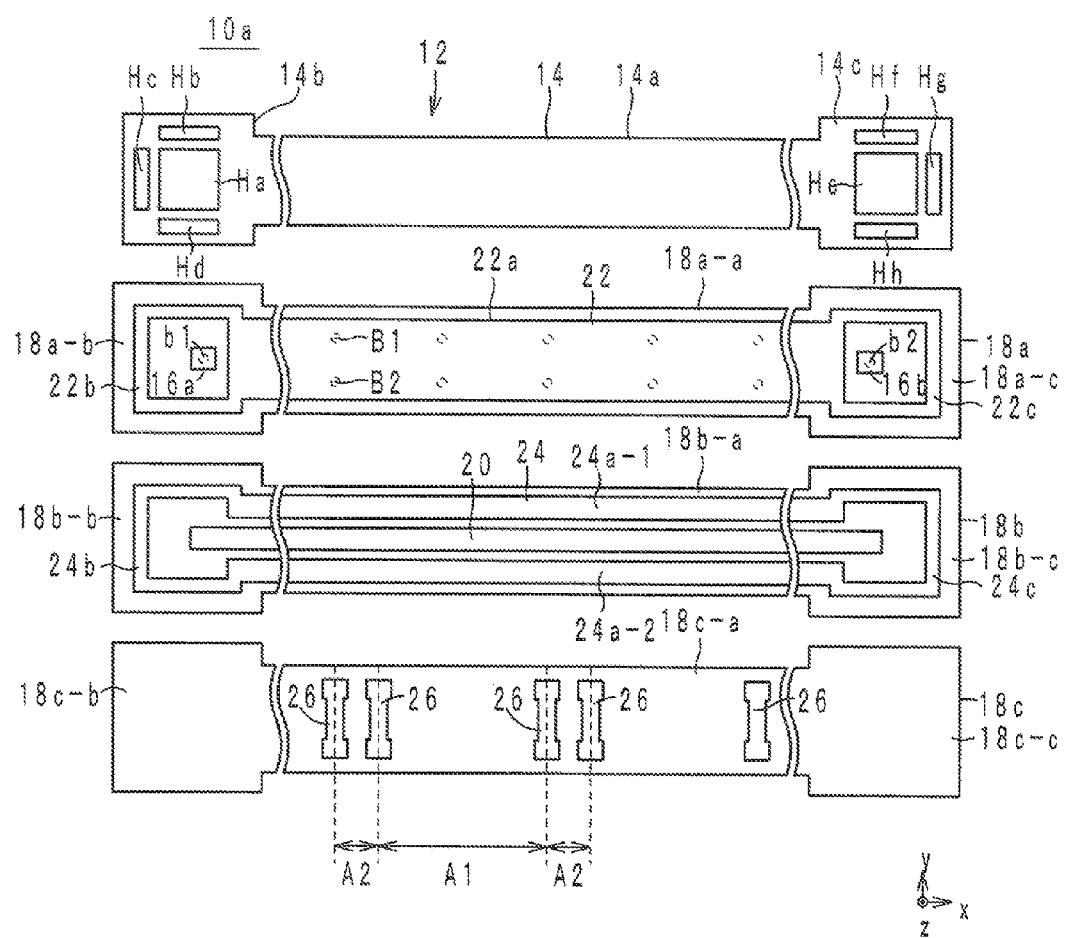
FIG. 8 is an exploded view of a dielectric element assembly of a high-frequency signal line according to a first modification of a preferred embodiment of the present invention.

The configuration of a high-frequency signal line according to a first modification of a preferred embodiment of the present invention will be described below with reference to the drawings. FIG. 8 is an exploded view of a dielectric element assembly of the high-frequency signal line 10a according to the first modification.

The high-frequency signal line 10a differs from the high-frequency signal line 10 in terms of the arrangement of the floating conductors 26. More specifically, the floating conductors 26 of the high-frequency signal line 10 are arranged at equal intervals. On the other hand, the floating conductors 26 of the high-frequency signal line 10a are arranged cyclically such that pairs of closely positioned floating conductors 26 are distanced at equal intervals. As a result, the characteristic impedance of the signal line 20 becomes relatively low in areas A2 where the pairs of floating conductors 26 are provided, and the characteristic impedance of the signal line 20 becomes relatively high in areas A1 where no pairs of floating conductors 26 are provided. Therefore, the characteristic impedance of the signal line 20 changes cyclically. In this manner, by changing the number of floating conductors 26, the length of the area A2 in the x-axis direction can be adjusted. Thus, it is possible to readily adjust the area A2 to a length that renders it possible to inhibit a standing wave from being produced in the signal line 20.

Second Modification

Figure 9:
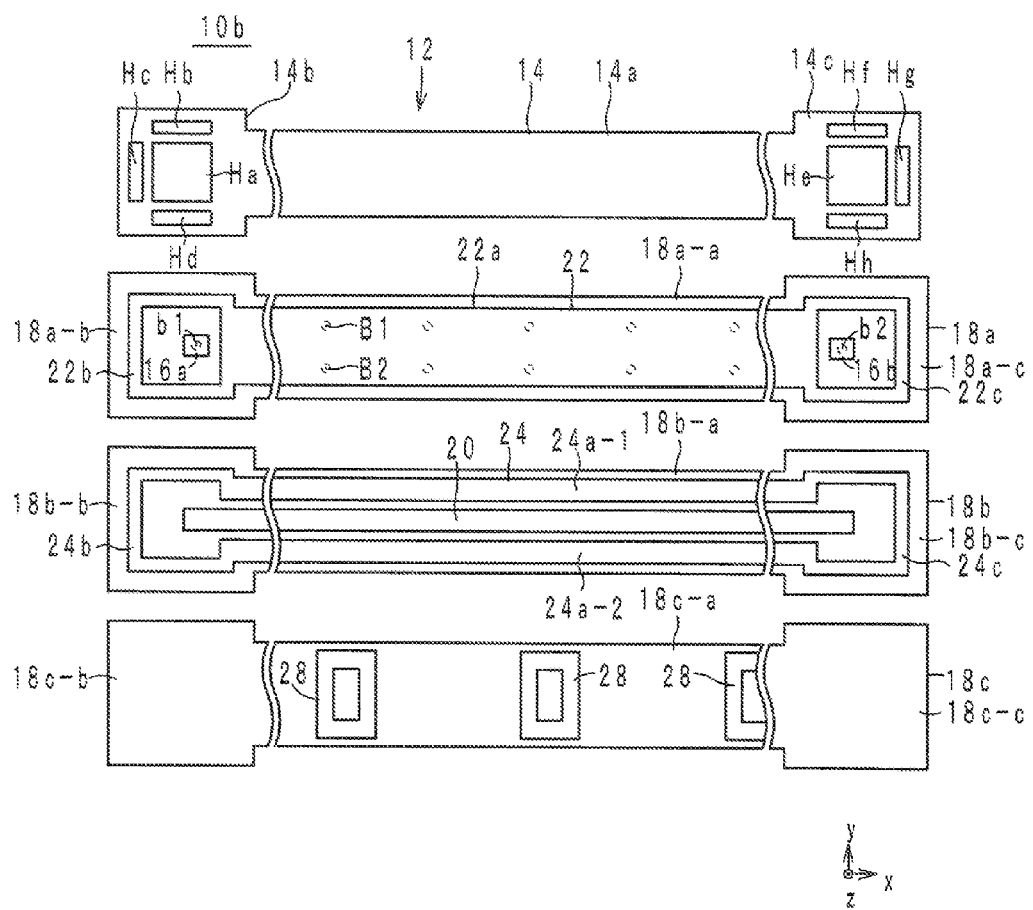
FIG. 9 is an exploded view of a dielectric element assembly of a high-frequency signal line according to a second modification of a preferred embodiment of the present invention.

The configuration of a high-frequency signal line according to a second modification of a preferred embodiment of the present invention will be described below with reference to the drawings. FIG. 9 is an exploded view of a dielectric element assembly of the high-frequency signal line 10b according to the second modification.

The high-frequency signal line 10b differs from the high-frequency signal line 10 in that floating conductors 28 different in shape from the floating conductors 26 are provided. More specifically, the floating conductors 26 of the high-frequency signal line 10 are linear conductors that extend in the y-axis direction. On the other hand, the floating conductors 28 of the high-frequency signal line 10b are in the form of rectangular or substantially rectangular frames. The area where such a floating conductor 28 overlaps with the ground conductor 24 is larger than the area where the floating conductor 26 of the high-frequency signal line 10 overlaps with the ground conductor 24. Thus, the value of the capacitance C2 becomes larger. In this manner, the floating conductors 28 in a different shape may be provided to change the value of the capacitances C2 and to adjust the characteristic impedance of the signal line 20.

Third Modification

Figure 10:
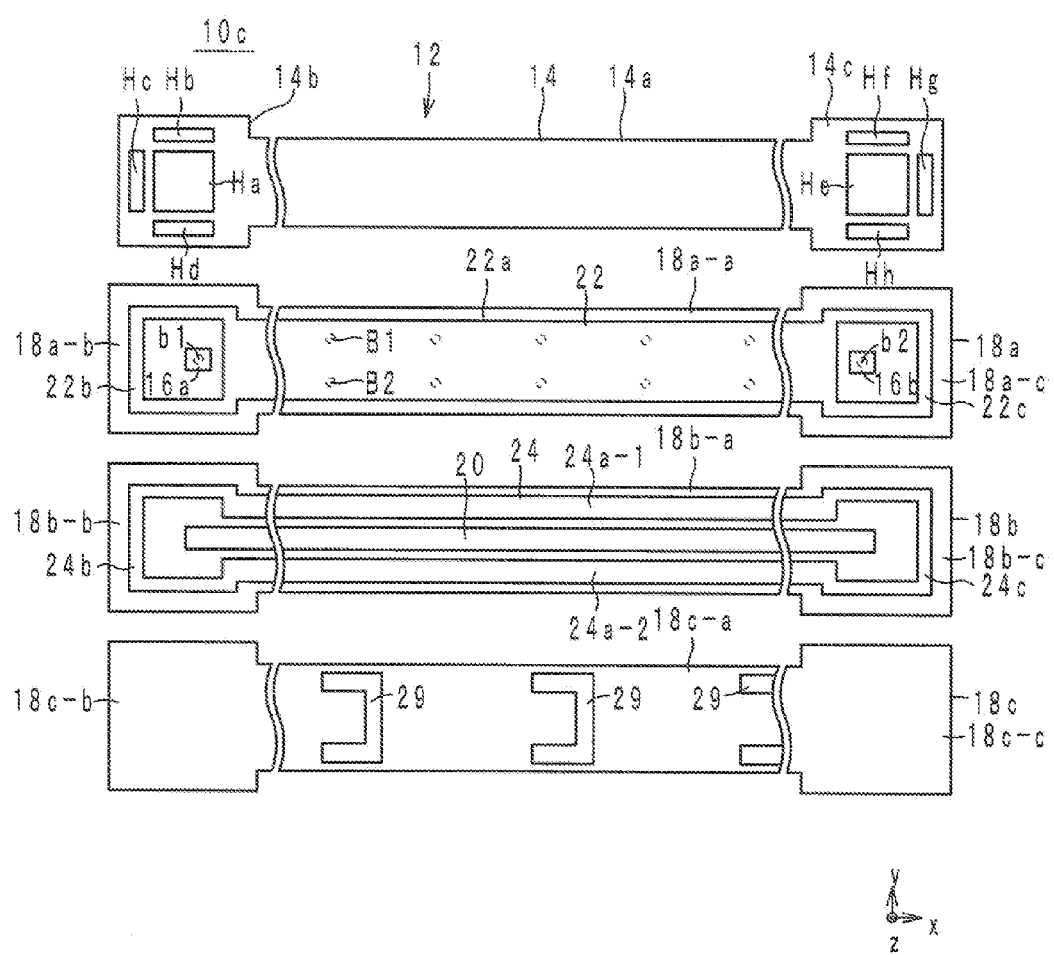
FIG. 10 is an exploded view of a dielectric element assembly of a high-frequency signal line according to a third modification of a preferred embodiment of the present invention.

The configuration of a high-frequency signal line according to a third modification of a preferred embodiment of the present invention will be described below with reference to the drawings. FIG. 10 is an exploded view of a dielectric element assembly of the high-frequency signal line 10c according to the third modification.

The high-frequency signal line 10c differs from the high-frequency signal line 10b in that floating conductors 29 different in shape from the floating conductors 28 are provided. More specifically, the floating conductors 28 of the high-frequency signal line 10b are in the form of rectangular or substantially rectangular frames. On the other hand, the floating conductors 29 of the high-frequency signal line 10c have a U-shaped or substantially U-shaped configuration. The area where such a floating conductor 29 overlaps with the signal line is smaller than the area where the floating conductor 28 overlaps with the signal line 20. Thus, the value of the capacitance C1 becomes smaller. In this manner, the floating conductors 29 in a different shape may be provided to change the value of the capacitances C1 and to adjust the characteristic impedance of the signal line 20.

Fourth Modification

Figure 11:
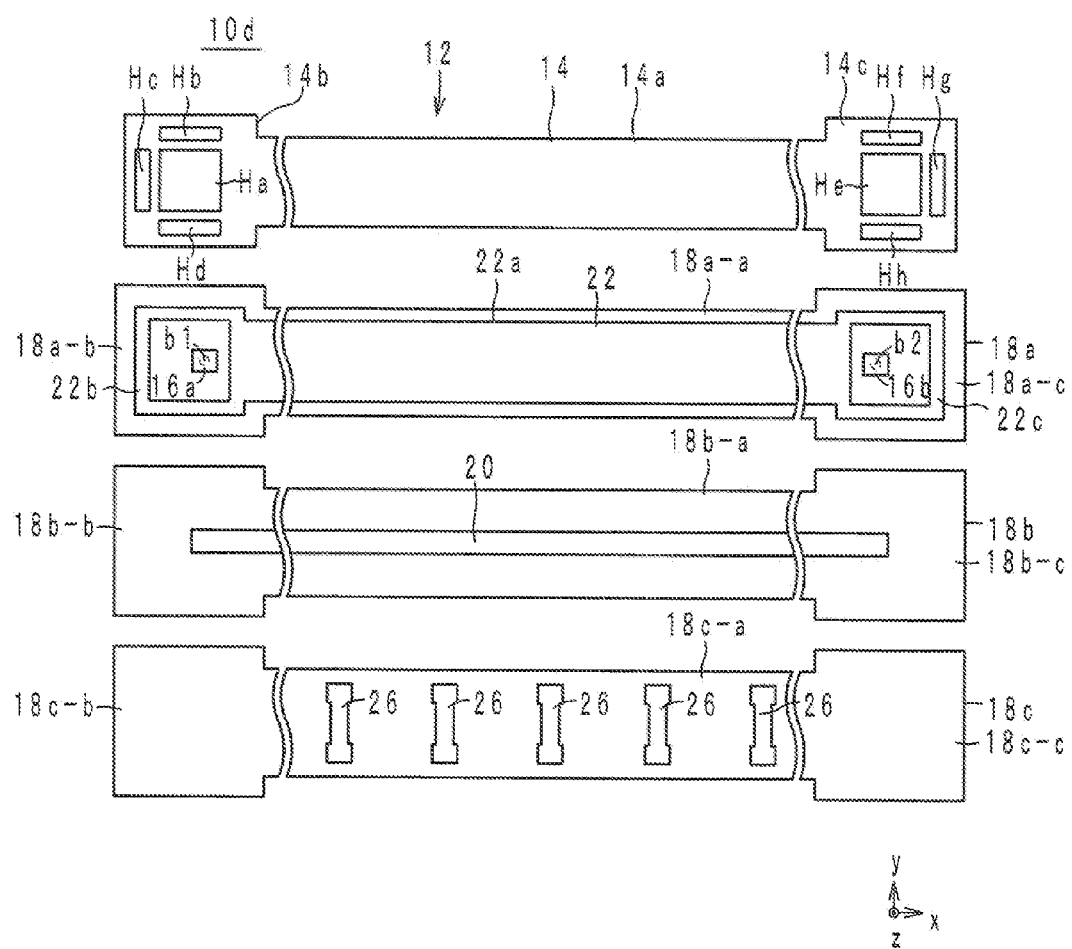
FIG. 11 is an exploded view of a dielectric element assembly of a high-frequency signal line according to a fourth modification of a preferred embodiment of the present invention.
Figure 12:
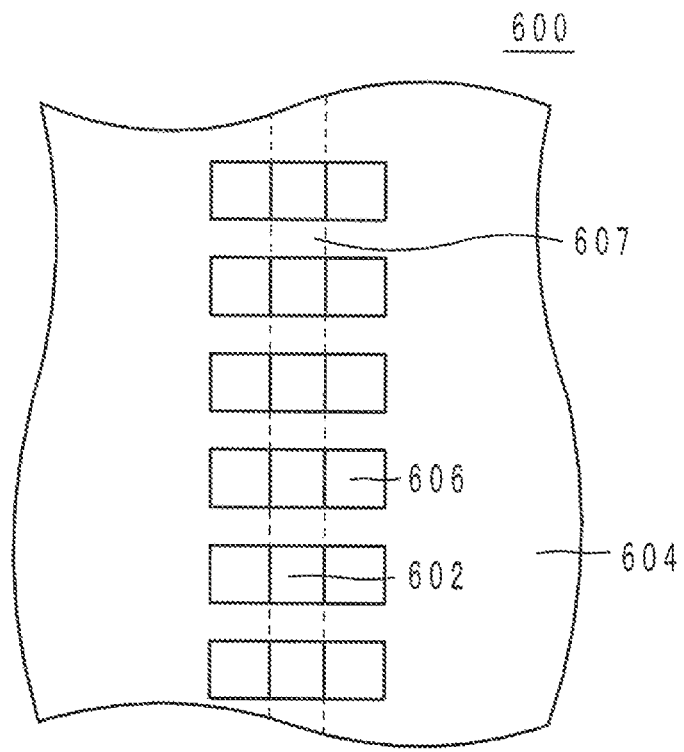
FIG. 12 illustrates a flexible board disclosed in Japanese Patent Laid-Open Publication No. 2007-123740, as viewed in a plan view in the direction of lamination.

The configuration of a high-frequency signal line according to a fourth modification of a preferred embodiment of the present invention will be described below with reference to the drawings. FIG. 11 is an exploded view of a dielectric element assembly of the high-frequency signal line 10d according to the fourth modification.

The high-frequency signal line 10d differs from the high-frequency signal line 10 in that the ground conductor 24 and the via-hole conductors B1 and B2 are not provided. More specifically, in the case of the high-frequency signal line 10d, since the ground conductor 24 is not provided, the ground conductor is provided on the positive side in the z-axis direction relative to the signal line 20, so as to be opposite to the floating conductors 26 with the dielectric sheets 18a and 18b positioned therebetween. As a result, the signal line 20 is brought into capacitive coupling with the ground conductor 22 directly and also indirectly via the floating conductors 26.

Furthermore, in the high-frequency signal line 10d, the via-hole conductors B1 and B2 are not provided in the dielectric sheet 18a. The equivalent circuit diagram of the high-frequency signal line 10d with such a configuration is the same as that shown in FIG. 7. In this case, the capacitance C2 between the floating conductor 26 and the ground conductor 22 and the capacitance C1 between the signal line 20 and the floating conductor 26 are designed such that their values have the relationship C1<C2 so as to inhibit spurious radiation.

The high-frequency signal line 10d thus configured, as with the high-frequency signal line 10, renders it possible to achieve reduction in high-frequency transmission loss and also reduction in thickness. Moreover, the via-hole conductors B1 and B2 are not provided in the dielectric sheet 18a, and therefore, the high-frequency signal line 10d can be more readily bent in use.

Other Preferred Embodiments

The present invention is not limited to the high-frequency signal lines 10 and 10a to 10d according to the above preferred embodiments, and variations can be made within the spirit and scope of the present invention.

Note that in the above preferred embodiments, the floating conductors 26 are preferably arranged so as to be perpendicular or substantially perpendicular to the signal line 20 when viewed in a plan view in the z-axis direction, but they do not have to be so arranged. Specifically, the floating conductors 26 may simply cross the signal line 20 when viewed in a plan view in the z-axis direction.

Furthermore, the configurations of the high-frequency signal lines 10 and 10a to 10d may be used in combination.

Furthermore, the high-frequency signal lines 10 and 10a to 10d may be used on RF circuit boards such as antenna front end modules.

Although the present invention has been described in connection with the preferred embodiments and variations thereof above, it is to be noted that various changes and modifications are possible to those who are skilled in the art. Such changes and modifications are to be understood as being within the scope of the present invention.

What is claimed is:

1. An electronic device comprising:
a housing; and
a high-frequency signal line accommodated in the housing; wherein
the high-frequency signal line includes:
an element assembly including a plurality of insulator layers;
a linear signal line provided in or on the element assembly;
a first ground conductor provided in or on the element assembly and extending along the signal line; and
a plurality of floating conductors provided in or on the element assembly on one side in a direction of lamination relative to the signal line and the first ground conductor, so as to be arranged along the signal line in an orientation crossing the signal line when viewed in a plan view in the direction of lamination; wherein
the floating conductors are opposite to the signal line and the first ground conductor with at least one of the insulator layers positioned therebetween;
the floating conductors are connected to neither the signal line nor the first ground conductor; and
a capacitance between the first ground conductor and each of the floating conductors is greater than a capacitance between the signal line and the floating conductor.

2. The electronic device according to claim 1, wherein the first ground conductor includes portions extending along the signal line on opposite sides of the signal line when viewed in the plan view in the direction of lamination.

3. The electronic device according to claim 1, wherein the first ground conductor is provided on a second side in the direction of lamination relative to the signal line, so as to be opposite to the signal line with at least one of the insulating layers positioned therebetween.

4. The electronic device according to claim 1, further comprising a second ground conductor provided on a second side in the direction of lamination relative to the signal line and the first ground conductor, so as to be opposite to the signal line with at least one of the insulating layers positioned therebetween.

5. The electronic device according to claim 4, wherein the first and second ground conductors are connected by via-hole conductors.

6. The electronic device according to claim 4, wherein
the first ground conductor is provided in the insulator layer on which the signal line is provided; and
the signal line is located farther from the second ground conductor in the direction of lamination than from the floating conductor in the direction of lamination.

7. A high-frequency signal line comprising:
an element assembly including a plurality of insulator layers;
a linear signal line provided in or on the element assembly;
a first ground conductor provided in or on the element assembly and extending along the signal line; and
a plurality of floating conductors provided in or on the element assembly on a first side in a direction of lamination relative to the signal line and the first ground conductor, so as to be arranged along the signal line in an orientation crossing the signal line when viewed in a plan view in the direction of lamination; wherein
the floating conductors are opposite to the signal line and the first ground conductor with at least one of the insulator layers positioned therebetween;
the floating conductors are connected to neither the signal line nor the first ground conductor; and
a capacitance between the first ground conductor and each of the floating conductors is greater than a capacitance between the signal line and the floating conductor.

8. The high-frequency signal line according to claim 7, wherein the first ground conductor includes portions extending along the signal line on opposite sides of the signal line when viewed in the plan view in the direction of lamination.

9. The high-frequency signal line according to claim 7, wherein the first ground conductor is provided on a second side in the direction of lamination relative to the signal line, so as to be opposite to the signal line with at least one of the insulating layers positioned therebetween.

10. The high-frequency signal line according to claim 7, wherein the insulator layers are flexible.

11. The high-frequency signal line according to claim 7, further comprising a second ground conductor provided on a second side in the direction of lamination relative to the signal line and the first ground conductor, so as to be opposite to the signal line with at least one of the insulating layers positioned therebetween.

12. The high-frequency signal line according to claim 11, wherein the first and second ground conductors are connected by via-hole conductors.

13. The high-frequency signal line according to claim 11, wherein
   the first ground conductor is provided in the insulator layer on which the signal line is provided; and
   the signal line is located farther from the second ground conductor in the direction of lamination than from the floating conductor in the direction of lamination.

\* \* \* \* \*